United States Patent [19]

Moser

[11] Patent Number: 6,121,771
[45] Date of Patent: Sep. 19, 2000

[54] MAGNETIC FORCE MICROSCOPY PROBE WITH BAR MAGNET TIP

[75] Inventor: Andreas Moser, San Jose, Calif.

[73] Assignee: International Business Machines Corporation, Armonk, N.Y.

[21] Appl. No.: 09/144,366

[22] Filed: Aug. 31, 1998

[51] Int. Cl.[7] ............................ G01R 33/02; G01R 33/12
[52] U.S. Cl. .................... 324/244; 324/244.1; 324/261; 324/262
[58] Field of Search ................................ 324/228, 244, 324/260, 261, 262

[56] References Cited

U.S. PATENT DOCUMENTS

| 5,021,364 | 6/1991 | Akamine et al. | 437/228 |
| 5,051,379 | 9/1991 | Bayer et al. | 437/225 |
| 5,171,992 | 12/1992 | Clabes et al. | 250/306 |
| 5,266,897 | 11/1993 | Watanuki et al. | 324/244 |
| 5,357,787 | 10/1994 | Kado et al. | 73/105 |
| 5,444,244 | 8/1995 | Kirk et al. | 250/306 |
| 5,900,729 | 5/1999 | Moser et al. | 324/244 |

OTHER PUBLICATIONS

Y. Martin et al., "High–resolution Magnetic Imaging of Domains in TbFe by Force Microscopy", Applied Physics Letter, vol. 52(3), Jan. 18, 1988, 244–246.

P.Grutter et al., "Magnetic force Microscopy with Batch–fabricated Force Sensors", Journal of Applied Physics, vol. 69(8), Apr. 15, 1991, 5883–5885.

C. Mathew Mate et al., "Atomic Force Microscopy Studies of Frictional Forces and of Force Effects in Scanning Tunneling Microscopy", Journal of Vacuum Science Technology, A vol.6(3), May/Jun. 1988, 575–576.

D. Rugar et al., "Force Microscope Using a Fiber–optic Displacement Sensor", Review of Scientific Instruments, vol. 59(11), Nov. 1988, 2337–2340.

Primary Examiner—Christine K. Oda
Assistant Examiner—Henry S. Andersen
Attorney, Agent, or Firm—Thomas R. Berthold

[57] ABSTRACT

A magnetic force microscopy (MFM) probe has an elongated probe tip with a planar surface onto which a uniformly thick magnetic film is formed. The probe tip is formed by focused ion beam (FIB) machining in a manner that creates both the planar surface and a triangular end with the triangular vertex forming the tip apex. Because the magnetic film is formed on a planar surface and has a uniform thickness it has the structural shape of an ideal bar magnet, with the triangular tip apex concentrating the magnetic flux from the ideal bar magnet to a very small volume. The probe tip has a length-to-width ratio of approximately 8:1 or greater, which gives rise to strong magnetic shape anisotropy. This stabilizes the magnetization of the tip in the presence of external magnetic fields, including fields from the sample. The probe is formed by FIB machining either the pyramidal probe portion of a conventional atomic force microscopy (AFM) integrated single-crystal silicon cantilever and probe, or the generally conically shaped or needle-like tip of a conventional AFM probe.

9 Claims, 4 Drawing Sheets

SIDE VIEW

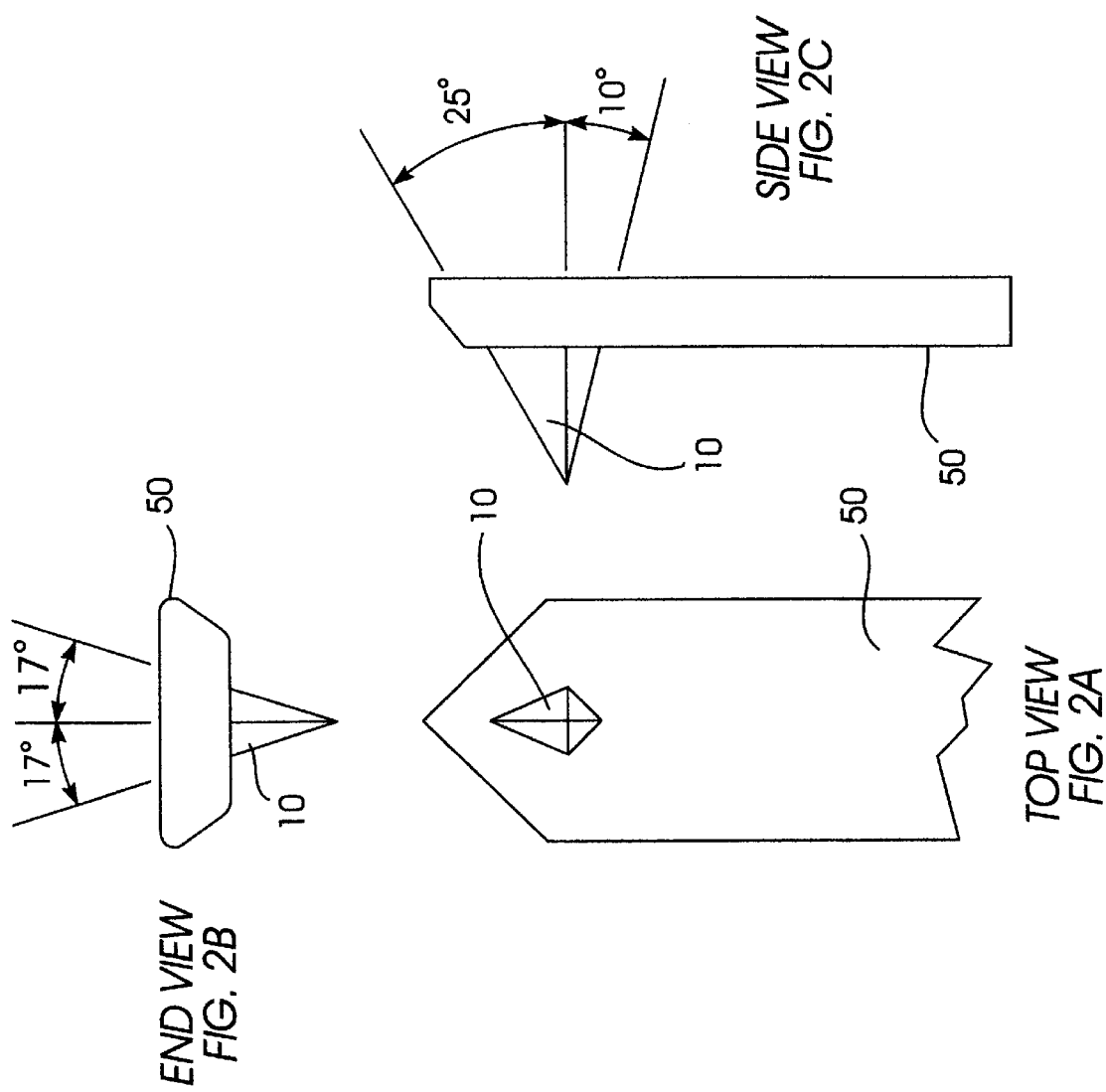

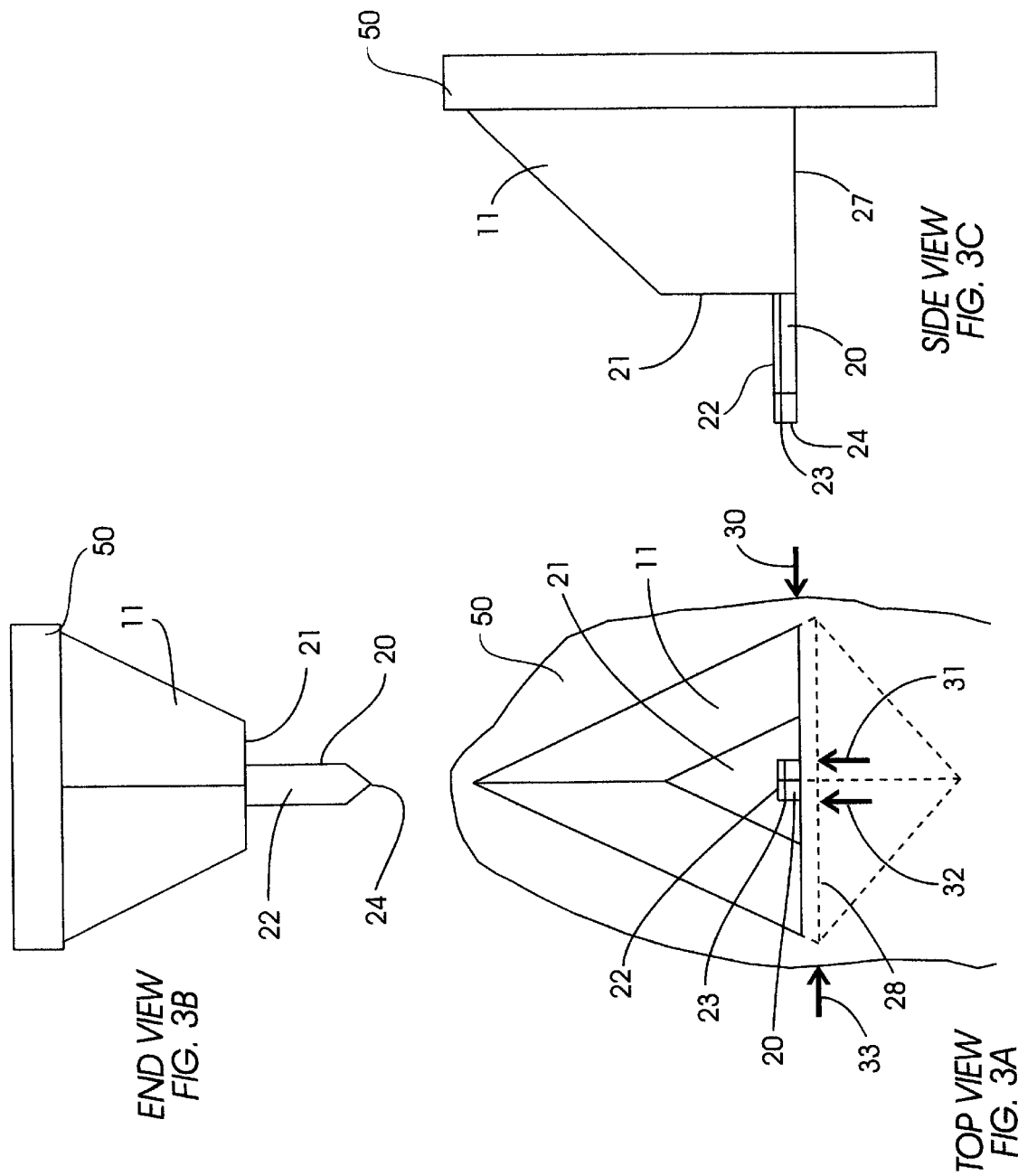

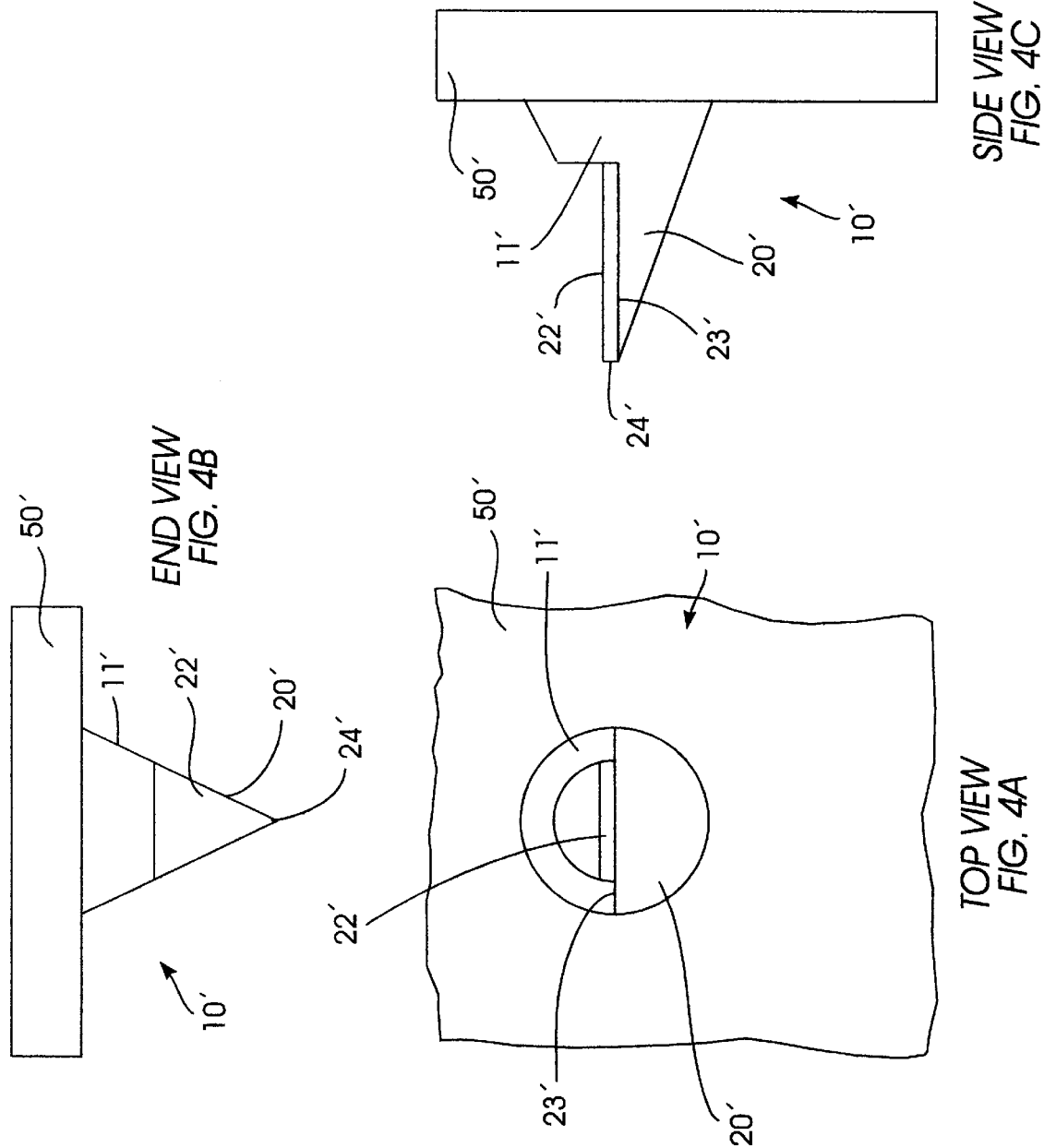

MAGNETIC FORCE MICROSCOPY PROBE WITH BAR MAGNET TIP

TECHNICAL FIELD

This invention relates to magnetic force microscopy (MFM) and more particularly to an MFM probe with a flat magnetic film on the probe tip that enables the probe tip to function essentially as an ideal bar magnet.

BACKGROUND OF THE INVENTION

Magnetic force microscopy (MFM) is a development of the noncontact surface analysis type of atomic force microscopy (AFM). MFM is well established as a technique for determining the magnetic fields emanating from magnetic samples, such as thin magnetic films used in magnetic recording media. In an MFM system, a sharp magnetic tip is mounted on a cantilever force sensor which is placed over the surface of the magnetic specimen while the specimen is scanned by a conventional XYZ scanning stage. The magnetic forces that act on the tip from the sample cause a static deflection of the cantilever. These forces are monitored, typically by use of a laser detection system wherein the deflection of the cantilever causes a displacement of a reflected laser light beam. MFM using a magnetized iron tip is described by Martin et al., "High-resolution Magnetic Imaging of Domains in TbFe by Force Microscopy", *Appl. Phys. Lett.*, Vol. 52, No. 3, Jan. 18, 1988, pp. 244–246. The use of silicon tips coated with a film of magnetic material, such as NiFe or CoPtCr, in MFM is described by Grütter et al., "Magnetic Force Microscopy with Batch-fabricated Force Sensors", *J. Appl. Phys.*, Vol. 69, No. 8, Apr. 15, 1991, pp. 5883–5885.

In conventional MFM systems, the probe tip is formed on the end of the cantilever to extend out of the plane of the cantilever in a direction generally perpendicular to the length of the cantilever. Thus, during scanning the cantilever is oriented generally parallel to the sample and the tip extends downward perpendicularly toward the surface of the sample. This perpendicular out-of-plane tip is formed either as a separate structure added to the cantilever end, as shown in U.S. Pat. No. 5,357,787, or as an integral part of the cantilever, as shown in U.S. Pat. Nos. 5,021,364; 5,051,379; and 5,444,244.

Probes with pyramidal tips coated with thin films of magnetic material are the most common type of MFM probes. These types of tips generally have a complex magnetization structure and as a result a complex distribution of magnetic charges due to the pyramidal geometrical shape of the magnetic film. As a result, the lateral resolution of such tips is only moderate. In addition, the stray magnetic field from these types of tips is difficult to calculate, which makes any attempt for quantitative analysis of the acquired MFM data difficult.

Another type of MFM tip, fabricated in an electron beam-induced deposition (EBID) process, is described in IBM's U.S. Pat. No. 5,171,992. This type of tip has a generally conical or needle-like shape and the material forming the tip is essentially a carbon matrix structure of decomposed organic reactants. The magnetic material is then sputtered on the needle-like tip from the side, thus forming a magnetic film on a portion of the generally conical surface of the needle-like tip, with the magnetic charges being localized at either end of the tip. While this type of tip has better performance than a pyramidal tip, it has an unfavorably broad magnetic charge distribution over the tip volume. This is because of the rotational symmetry of the needle-like structure and the round, non-pointed shape of the tip apex, and because of the non-uniform thickness of the magnetic film caused by the geometry of the needle-like shape of the tip.

The use of a focused ion beam (FIB) to machine the tip of an AFM probe is known. For example, a tapping mode FIB machined silicon probe is available from Digital Instruments for use in AFM imaging of samples with deep trenches or steep sidewalls. However, FIB has not been used in the fabrication of MFM probes, and no method of how FIB could be applied to fabricating MFM probes has been suggested.

What is needed is an improved MFM probe with a tip that forms an essentially ideal bar magnet to generate a localized narrow size distribution of magnetic charge close to the sample.

SUMMARY OF THE INVENTION

The invention is an MFM probe that has an elongated probe tip with a planar surface onto which a uniformly thick magnetic film is formed. The probe tip is formed by FIB machining in a manner that creates both the planar surface and a triangular end with the triangular vertex forming the tip apex. Because the magnetic film is formed on a planar surface and has a uniform thickness it has the structural shape of an ideal bar magnet, with the triangular tip apex concentrating the magnetic flux from the ideal bar magnet to a very small volume. The probe tip has a length-to-width ratio of approximately 8:1 or greater, which gives rise to strong magnetic shape anisotropy. This stabilizes the magnetization of the tip in the presence of external magnetic fields, including fields from the sample. The probe is formed by FIB machining either the pyramidal probe portion of a conventional AFM integrated single-crystal silicon cantilever and probe, or the generally conically shaped or needle-like tip of a conventional AFM probe, such as the tips formed by EBID.

For a fuller understanding of the nature and advantages of the present invention, reference should be made to the following detailed description taken together with the accompanying figures.

BRIEF DESCRIPTION OF THE DRAWING

FIGS. 2A–2C are bottom, end and side views, respectively, of an integrated silicon cantilever and probe showing the pyramidal probe from which the MFM probe of the present invention is fabricated.

FIGS. 3A–3C are bottom, end and side views, respectively, of the integrated silicon cantilever and probe according to the preferred embodiment of the present invention showing the probe tip extending from the truncated pyramidal probe body after FIB machining.

FIGS. 4A–4C are bottom, end and side views, respectively, of an alternative embodiment of the MFM probe according to the present invention.

DESCRIPTION OF THE PREFERRED EMBODIMENTS

Figure 1:
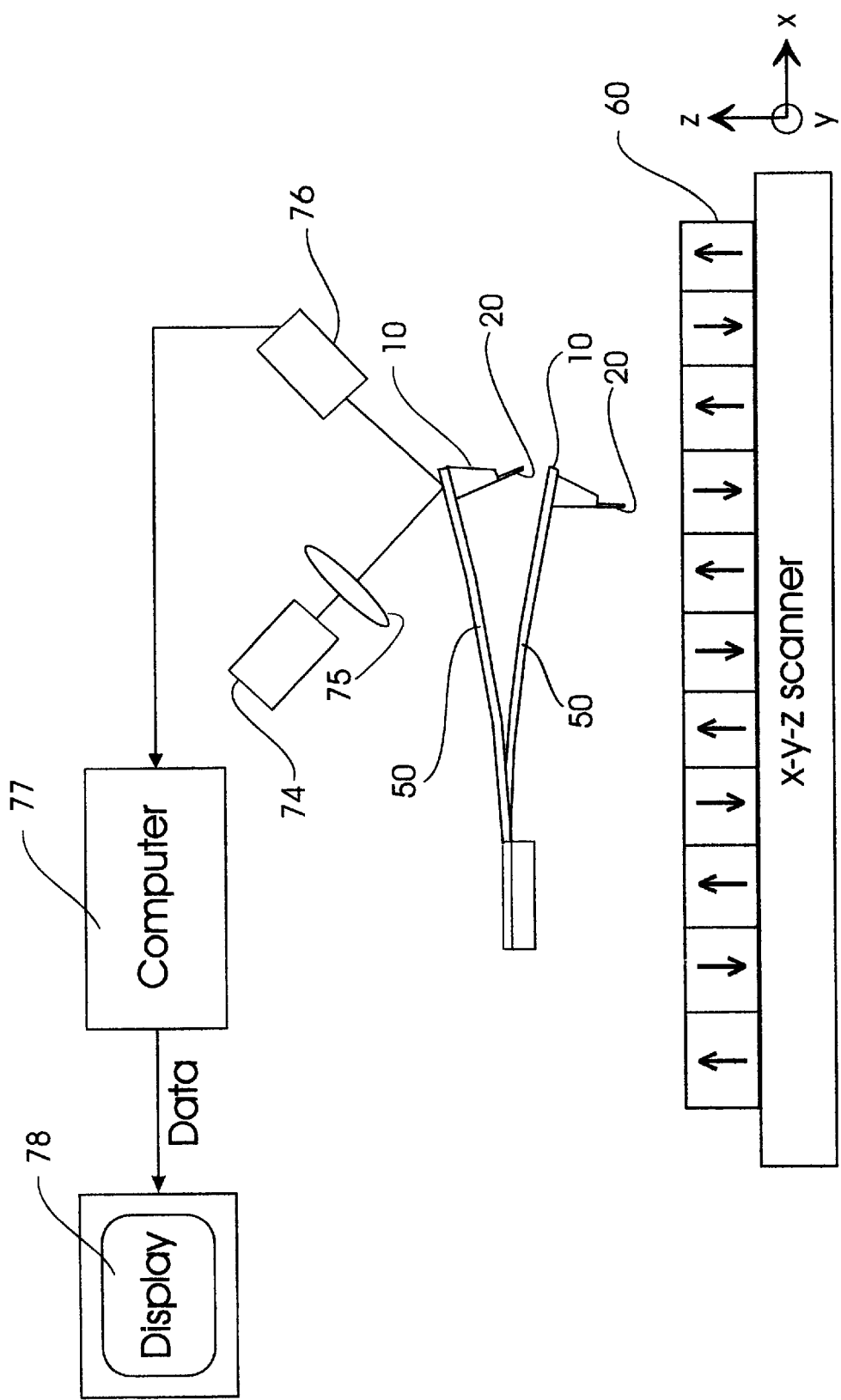
FIG. 1 is a schematic of the MFM system with the MFM probe of the present invention.

The principles of MFM are derived from scanning probe microscopy (SPM) and thus use a probe with a sharp tip mounted on a weak cantilever spring. In SPM, the tip is brought close to the sample and a piezoelectric scanner moves the sample relative to the probe tip in a raster pattern.

Interactions between the tip and sample deflect the cantilever. The deflection is monitored by reflecting a laser beam from a laser off the cantilever into a segmented photodiode, also called a quadrant detector. An image is formed by mapping this laser-detected deflection while scanning. Feedback from a controller continually adjusts the Z (vertical) position of the sample to keep the cantilever deflection at a constant value while scanning. Cantilever springs can be made weaker than interatomic bonds (about 1 newton/meter), thus allowing imaging with atomic resolution. For MFM, batch-microfabricated silicon probes are magnetically sensitized by evaporating or sputter coating with a ferromagnetic material. The magnetized tip is scanned several tens or hundreds of nanometers above the sample, avoiding contact. Magnetic field gradients from the sample exert a force on the magnetic moment of the tip, and monitoring the tip/cantilever response gives a magnetic force image. To enhance sensitivity, most MFM instruments oscillate the cantilever near its resonant frequency (around 100 kHz) with a piezoelectric element. Gradients in the magnetic forces on the tip shift the resonant frequency of the cantilever. Monitoring this shift, or related changes in oscillation amplitude or phase, produces a magnetic force image that can be viewed on a computer display.

The principle of MFM can be better understood by reference to FIG. 1, which shows schematically an essentially conventional MFM system, but one which uses the probe of the present invention. The MFM system includes the MFM probe 10 of the present invention, which is attached to a flexible cantilever 50. The probe 10 and cantilever 50 are depicted in FIG. 1 with the probe 10 in two exaggerated extreme positions, one where it is closest to the surface of a sample 60 and the other where it is located farthest from the surface of sample 60. The sample 60 may be any type of magnetic material, but is depicted in FIG. 1 as a sample of perpendicular recording magnetic thin film. The sample 60 is supported on a conventional XYZ scanner of the type used in MFM systems. In MFM systems the tip 20 is oriented perpendicularly to the surface of the sample 60. In the system of FIG. 1, this is accomplished with a cantilever 50 that is oriented generally parallel to the surface of sample 60 and a tip that extends perpendicularly from the cantilever 50. However, in other types of MFM systems, the cantilever may make an angle with the sample, e.g., canted downward at a small angle, in which case the tip is formed on the cantilever with this additional angle so that the tip is maintained perpendicular to the surface of the sample. The XYZ scanner is a piezo device that is moved in the XY direction so that the tip 20 of probe 10 can be located over different XY positions of the sample 60. The distance between the tip 20 of the probe 10 and the surface of the sample 60 is maintained fixed by the scanner controlling the Z position of the sample 60. MFM systems also exist wherein the sample is fixed and the cantilever with probe is attached to an XYZ scanner. A laser source 74 generates a laser light beam through a lens 75 to the back of cantilever 50, and a quadrant detector 76 detects light reflected from the cantilever 50. A computer 77 analyzes the output from quadrant detector 76 and generates an image on display 78. The image is representative of the Z position of the probe tip 20 and thus of the magnetic fields distributed across the XY surface of of the sample 60.

As an alternative to the reflected laser light detection technique, the deflection of cantilever 50 can also be detected by the use of the known AFM measurement techniques based upon tunneling current, capacitance, fiber interferometry and piezoresistance. The use of tunneling current measurement for cantilever deflection measurement in an MFM system is described in IBM's U.S. Pat. No. 5,266,897. The use of a capacitive deflection detector is described by C. M. Mate et al., "Atomic Force Microscopy Studies of Frictional Forces and of Force Effects in Scanning Tunneling Microscopy", J. Vac. Sci. Technol. A, 1988, Vol. 6, p. 575. The use of a fiber interferometry deflection detection technique is described by D. Rugar et al., "Force Microscope Using a Fiber-Optic Displacement Sensor", Rev. Sci. Instr., 1988, Vol. 59, p. 2337. The use of a piezoresistive AFM cantilever is described in U.S. Pat. No. 5,345,815 assigned to Stanford University. The piezoresistive cantilever is formed of single-crystal silicon which is implanted with a dopant to provide a piezoresistive region along the length of the cantilever and deflection of the free end of the cantilever produces stress in the cantilever, which changes the electrical resistance of the piezoresistive region in proportion to the cantilever's deflection.

Referring now to FIGS. 2A–2C, a conventional etched silicon probe 10 is shown that serves as the starting point for the fabrication of the MFM probe according to the present invention. The cantilever 50 and probe 10 are an integrated single-piece structure formed of single crystal silicon, wherein the silicon has been etched along crystalline planes to form the pyramidal probe 10.

Referring now to FIGS. 3A–3C, the MFM probe according to the present invention is shown. The probe 10 of FIGS. 2A–2C has been machined with a focused ion beam (FIB) to create the truncated pyramid shaped probe body 11 with the pillar-like shaped probe tip 20 that extends from surface 21 of probe body 11. A thin film 22 of magnetic material has been sputter deposited onto a planar surface 23 of the tip 20 to form the completed probe tip. The probe tip 20 has an apex 24 which was essentially the apex of the pyramidal probe before FIB machining. The dashed lines in FIG. 3A represent the shape of the pyramid before FIB machining.

To form the probe 10, the FIB is directed parallel to the surface of cantilever 50, but in various directions, as shown by arrows 30, 31, 32. FIB systems and details of their operation are well known and available from FIB system manufacturers, such as Micrion of Peabody, Mass. and FEI Company of Hillsboro, Oreg. A typical FIB has a diameter of 10 nm.

First, the FIB is directed along arrow 30 to form the back surface 27. This cut is made just slightly to one side of the plane that intersects the pyramid apex (i.e., the plane shown by dashed line 28). Thus the resulting tip apex 24 does not precisely coincide with the pyramid apex. The cut along arrow 30 is made substantially all the way down to the cantilever 50, with the result that this first cut removes substantially two faces of the pyramid. Next, two cuts are made in the direction indicated by arrows 31, 32 part way down the pyramid, stopping at elevated plane 21. These two cuts define the two side edges of the tip 20. Finally, a cut is made along arrow 33 down to elevated plane 21 to define the planar surface 23 of tip 20. In the embodiment of FIGS. 3A–3C, the back surface 27 is cut to be perpendicular to the cantilever 50. However, if the cantilever is intended to operate in an MFM system where it is canted downward relative to the surface of the sample, then the back surface 27 would be cut with this additional angle. For example, if the cantilever is to be canted downward at 12°, then the back surface would be cut to be 102° relative to the cantilever. This completes the FIB machining. Typical dimensions of the completed probe tip are a length of 1 micron (1000 nm) and a width of 150 nm, for a length-to-width ratio of approximately 8:1. This high ratio gives rise to strong magnetic shape anisotropy in the probe tip, which stabilizes the magnetization of the tip in the presence of external magnetic fields, including fields from the sample.

After the FIB machining, the thin film 22 of magnetic material is formed on the planar surface 23 of the probe tip 20. The cantilever 50 with probe 10 and its extending tip 20 is placed in a vacuum deposition chamber with the planar surface 23 oriented generally perpendicular to the source of material to be deposited. A film of magnetic material, such as cobalt, is deposited from the direction of the source onto the tip 20 to form the surface layer 22 of ferromagnetic material on the surface 23. In the preferred embodiment, 16 nm of cobalt are deposited, followed by 3 nm of platinum. The platinum provides corrosion protection for the underlying cobalt. The cobalt and platinum layers form the thin film 22 of magnetic material shown in FIGS. 3A–3C. The cobalt and platinum layers can also be deposited by conventional evaporation or sputtering. The magnetic film 22 of the probe tip 20 can be formed of any ferromagnetic material, such as iron, cobalt and nickel and their alloys, including alloys such as CoPtCr, NiFe and SmCo. The magnetic film 22 can also be formed of paramagnetic materials, such as Pd and Pt, and superparamagnetic materials, such as small (approximately 4 nm diameter) Fe, Ni and Co particles. Because the thin magnetic film 22 is deposited on a substantially planar surface 23, it has a generally uniform thickness across the planar surface 23. The result is that the magnetic film 22 has the physical shape of an ideal bar magnet.

An alternative MFM probe according to the present invention is shown in FIGS. 4A–4C. The probe 10' comprises a probe body 11' and a tip 20' with a thin film 22' of magnetic material formed on a planar surface 23' of the tip 20'. The primary difference between the probe of FIGS. 4A–4C and the probe of FIGS. 3A–3C is the starting point. In the embodiment of FIGS. 4A–4C, the starting point is a generally conically shaped tip that has been grown by EBID according to the process described in the previously cited '992 patent. This conical tip is then FIB machined to form the planar surface 23' and the magnetic film 22' is then formed onto planar surface 23' in the same manner as described above for the embodiment of FIGS. 3A–3C. A portion of the base of the conical tip serves as the body portion 11' of probe 10'. However, FIB machining can be made substantially all the way down to cantilever 50', in which case the lower portion of the remaining half-cone near the cantilever 50' serves as the body portion 11'. The apex 24', like the apex 24 in the embodiment of FIGS. 3A–3C, is generally triangularly shaped, which provides an important feature of the present invention because it allows the flux to be concentrated substantially at the apex of the triangle. While the embodiment shown in FIGS. 4A–4C is depicted substantially as a cone for ease of illustration, it is understood that this generally conically shaped tip also includes tips that may appear to have more of a cylindrical or needle-like shape.

In both embodiments of the present invention a nearly ideal bar magnet is formed. The magnetic flux is guided through the magnetic film to the triangularly shaped apex and does not form any spurious charges. The triangular shape of the tip apex concentrates the flux at the apex in a small volume, forming a localized charge distribution.

While the preferred embodiments of the present invention have been illustrated in detail, it should be apparent that modifications and improvements may be made to the invention without departing from the spirit and scope of the invention as described in the following claims.

What is claimed is:

1. A magnetic force microscopy probe comprising;
    a probe body shaped substantially as the base of a cone;
    an elongated tip extending from the probe body and terminating at an apex, the tip having a generally planar surface between the probe body and the apex, the planar surface of the tip having a generally triangular shape formed by truncating a cone substantially through its central axis, whereby the vertex of the triangularly shaped planar surface forms the apex of the probe tip; and
    a layer of magnetic material formed on said planar tip surface.

2. The probe according to claim I wherein the magnetic material on said planar tip surface consists of a ferromagnetic material selected from the group consisting of cobalt, iron, nickel and alloys of cobalt, iron or nickel.

3. The probe according to claim 1 wherein the magnetic material on said planar tip surface consists essentially of a paramagnetic or a superparamagnetic material.

4. The probe according to claim 1 further comprising a cantilever attached at one of its ends to the probe body.

5. A cantilever assembly for use in a magnetic force microscopy system comprising:
    a single piece of single-crystal silicon comprising a) a flexible generally planar shaped cantilever portion, b) a generally truncated pyramid shaped probe body portion having the base of its pyramid located on the planar cantilever at one end of the cantilever and an elevated generally planar surface spaced from the planar cantilever, and c) an elongated tip portion extending from said elevated planar surface and terminating at an apex, the tip portion having a generally planar surface between said elevated surface and said apex; and
    a layer of magnetic material formed on said planar surface of the tip portion of the cantilever.

6. The probe according to claim 5 wherein the tip portion extends from said elevated planar surface so as to be generally perpendicular to said planar cantilever portion.

7. The probe according to claim 5 wherein the magnetic material on said planar tip surface consists of a ferromagnetic material selected from the group consisting of cobalt, iron, nickel and alloys of cobalt, iron or nickel.

8. The probe according to claim 5 wherein the magnetic material on said planar tip surface consists essentially of a paramagnetic or a superparamagnetic material.

9. The probe according to claim 5 wherein the apex of the probe tip corresponds generally to the apex of the pyramid from which the probe body portion is formed.

\* \* \* \* \*